(12) United States Patent
Shih et al.

(10) Patent No.: US 8,877,629 B2
(45) Date of Patent: Nov. 4, 2014

(54) SEMICONDUCTOR MANUFACTURING PROCESS AND STRUCTURE THEREOF

(71) Applicant: Chipbond Technology Corporation, Hsinchu (TW)

(72) Inventors: Cheng-Hung Shih, Changhua County (TW); Yung-Wei Hsieh, Hsinchu (TW); Kai-Yi Wang, New Taipei (TW)

(73) Assignee: Chipbond Technology Corporation, Hsinchu (TW)

( * ) Notice: Subject to any disclaimer, the term of this patent is extended or adjusted under 35 U.S.C. 154(b) by 154 days.

(21) Appl. No.: 13/743,450

(22) Filed: Jan. 17, 2013

(65) Prior Publication Data

US 2014/0159234 A1 Jun. 12, 2014

(30) Foreign Application Priority Data

Dec. 10, 2012 (TW) .............................. 101146475 A

(51) Int. Cl.
| | |
|---|---|
| *H01L 21/44* | (2006.01) |
| *H01L 23/498* | (2006.01) |
| *H01L 21/768* | (2006.01) |
| *H01L 23/00* | (2006.01) |

(52) U.S. Cl.
CPC .... *H01L 23/49811* (2013.01); *H01L 21/76885* (2013.01); *H01L 24/11* (2013.01)
USPC .......................................... 438/613; 257/737

(58) Field of Classification Search
CPC .............. H01L 23/49811; H01L 24/81; H01L 21/76885
USPC .......................................... 438/613; 257/737
See application file for complete search history.

(56) References Cited

U.S. PATENT DOCUMENTS

| | | | | |
|---|---|---|---|---|
| 8,450,049 B2 * | 5/2013 | Kuo et al. | ..................... | 430/313 |
| 8,581,404 B2 * | 11/2013 | Chou et al. | ..................... | 257/750 |

FOREIGN PATENT DOCUMENTS

| | | |
|---|---|---|
| JP | 7-161722 A | 6/1995 |
| JP | 2004-327921 A | 11/2004 |

OTHER PUBLICATIONS

Japanese Office Action dated Feb. 25, 2014 for Japanese Patent Application No. 2013-001781, 2 pages.

* cited by examiner

*Primary Examiner* — Theresa T Doan
(74) *Attorney, Agent, or Firm* — Jackson IPG PLLC

(57) ABSTRACT

A semiconductor manufacturing process includes the following steps of providing a silicon substrate having at least one connection pad and a protection layer, forming a first seed layer having at least one first section and at least one second section, forming a first photoresist layer, forming a first buffer layer having a coupling portion and a cladding portion, removing the first photoresist layer, removing the second section of the first seed layer to form a first under bump metallurgy layer, forming a support layer on the protection layer and the first buffer layer, the first under bump metallurgy layer has a first ring wall, the first buffer layer has a second ring wall, wherein the first ring wall, the second ring wall and the cladding portion are cladded by the support layer, and forming a connection portion and covering the coupling portion with the connection portion.

11 Claims, 14 Drawing Sheets

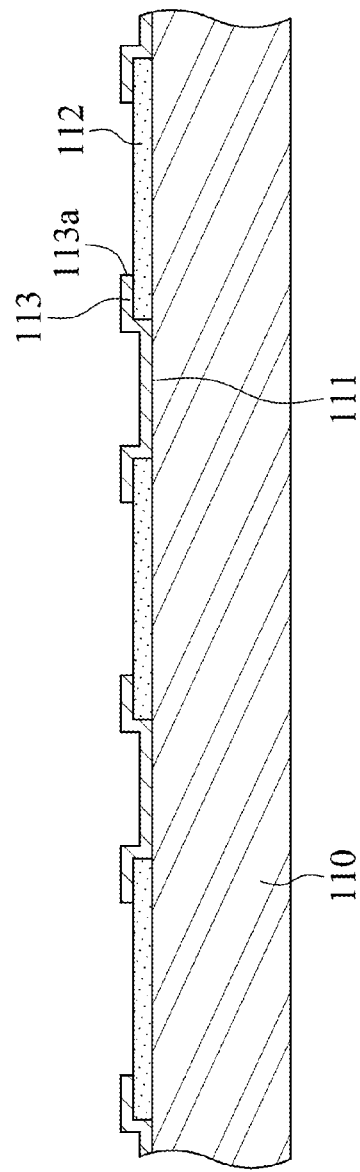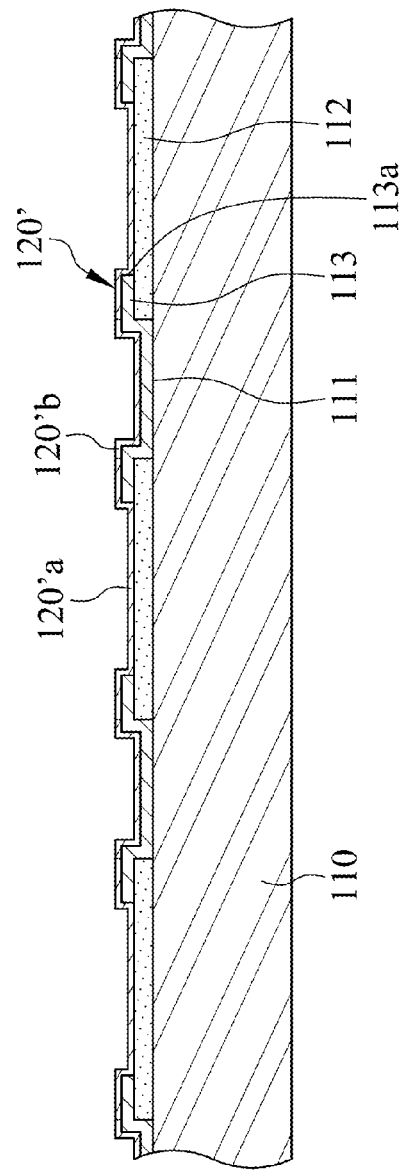
FIG. 3A
FIG. 3B

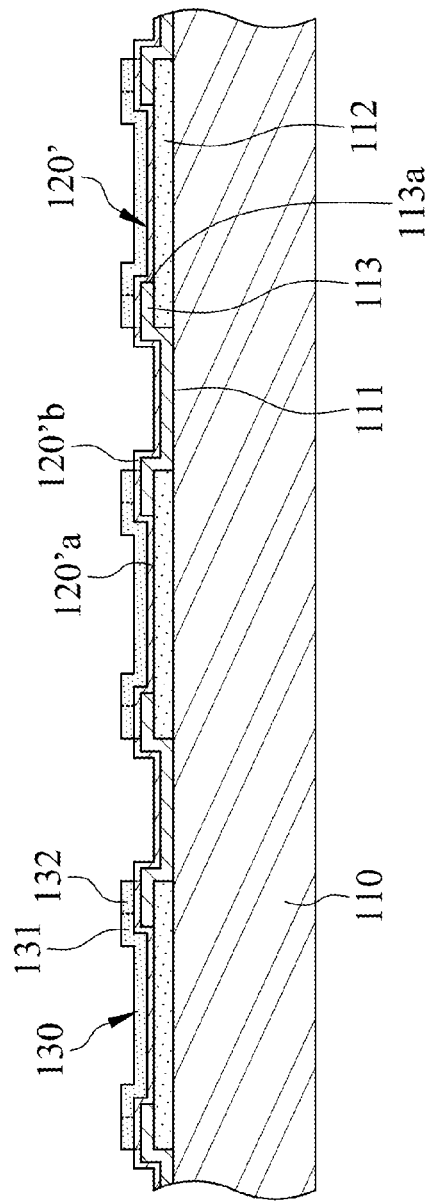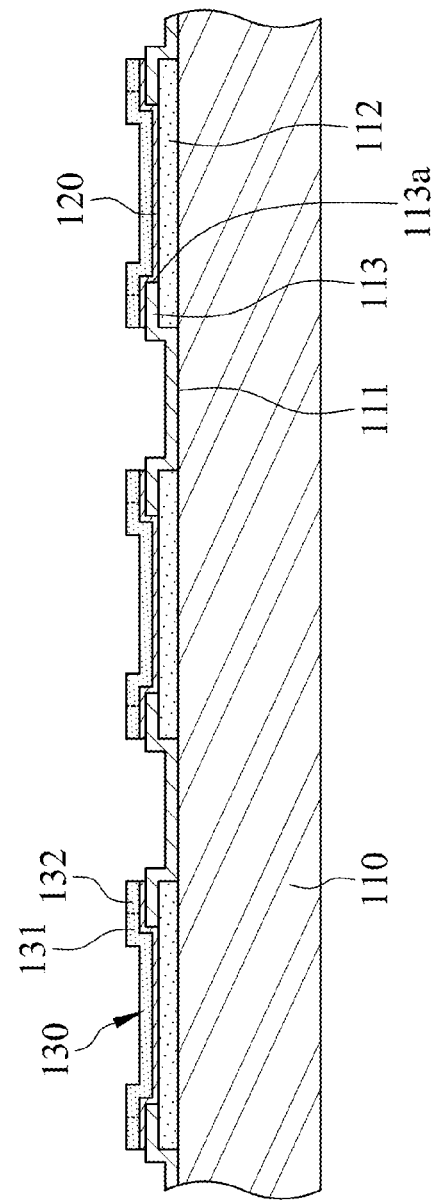
FIG. 3E
FIG. 3F

SEMICONDUCTOR MANUFACTURING PROCESS AND STRUCTURE THEREOF

FIELD OF THE INVENTION

The present invention is generally related to a semiconductor manufacturing process, which particularly relates to the semiconductor manufacturing process with feature of enhancement structure.

BACKGROUND OF THE INVENTION

A conventional semiconductor structure 200 includes a silicon substrate 210, an under bump metallurgy layer 220 and a solder ball 230 as illustrated in FIG. 1. The silicon substrate 210 comprises an aluminum pad 211 and a protection layer 212, the under bump metallurgy layer 220 electrically connects to the aluminum pad 211, and the solder ball 230 is formed on the under bump metallurgy layer 220. Under the ball shear test for the semiconductor structure 200, owing to the material difference between the aluminum pad 211, the under bump metallurgy layer 220 and the solder ball 230, an intermetallic interface obviously exists therefore becoming the most fragile part in the semiconductor structure 200, which likely results in separation of the under bump metallurgy layer 220 from the aluminum pad 211 or even worse in destruction of the aluminum pad 211 so that the yield rate in manufacturing the semiconductor structure 200 is substantially reduced.

SUMMARY

The primary object of the present invention is to provide a semiconductor manufacturing process that includes the following steps: providing a silicon substrate having a surface, at least one connection pad formed on the surface and a protection layer formed on the surface, the protection layer covers the connection pad and comprises at least one first opening revealing the connection pad, next, forming a first seed layer on the protection layer and the connection pad, the first seed layer comprises at least one first section and at least one second section located outside the first section, afterwards, forming a first photoresist layer on the first seed layer, wherein the first photoresist layer comprises at least one first opening slot to reveal the first section, thereafter, forming a first buffer layer at the first opening slot, the first buffer layer covers the first section of the first seed layer and comprises a coupling portion and a cladding portion, after that, removing the first photoresist layer to reveal the second section of the first seed layer, next, removing the second section of the first seed layer to make the first section formed as a first under bump metallurgy layer, afterwards, forming a support layer on the protection layer and the first buffer layer, the support layer comprises at least one second opening revealing the coupling portion of the first buffer layer, the first under bump metallurgy layer comprises a first ring wall, the first buffer layer comprises a second ring wall, wherein the first ring wall of the first under bump metallurgy layer, the second ring wall and the cladding portion of the first buffer layer are cladded by the support layer, and forming a connection portion at the second opening and covering the coupling portion of the first buffer layer with the connection portion. Under the ball shear test for the semiconductor structure, owning to the first ring wall of the first under bump metallurgy layer, the second ring wall and the cladding portion of the first buffer layer cladded by the support layer and the first under bump metallurgy layer covered by the first buffer layer, the semiconductor structure of the present invention prevents the first under bump metallurgy layer from separating from the connection pad or from damaging the connection pad so that the yield rate in manufacturing the semiconductor structure is well increased.

DESCRIPTION OF THE DRAWINGS

FIGS. 3A to 3I are cross-section views illustrating the semiconductor manufacturing process in accordance with a preferred embodiment of the present invention.

DETAILED DESCRIPTION OF THE INVENTION

Figure 1:
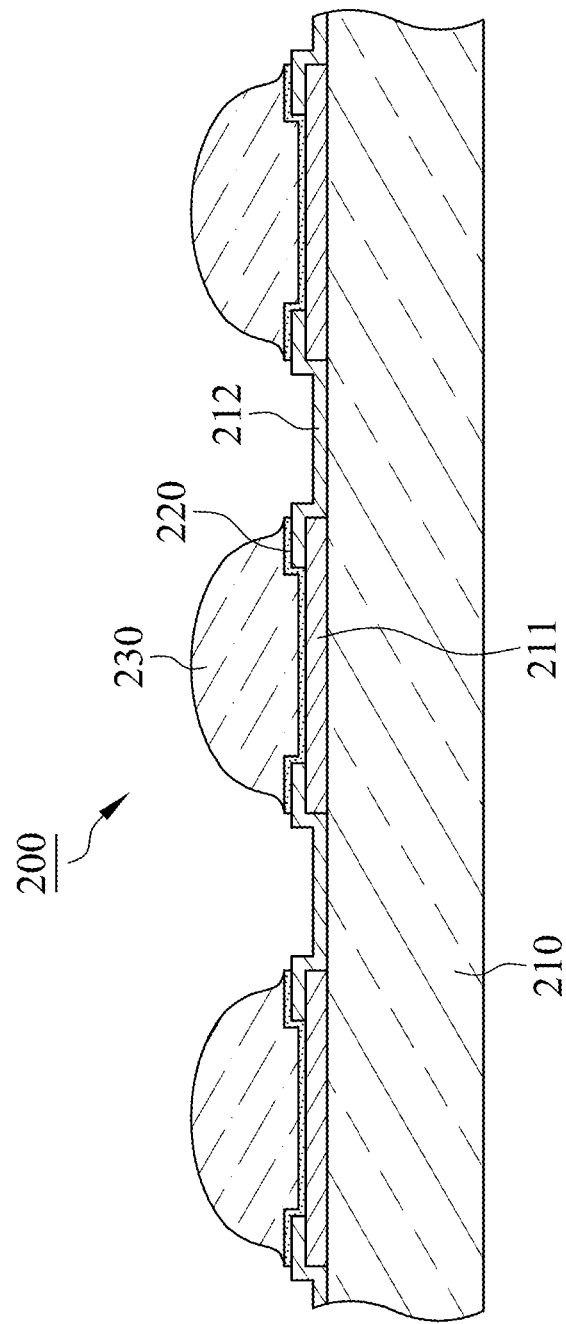
FIG. 1 is a schematic diagram illustrating a conventional semiconductor structure.
Figure 2:
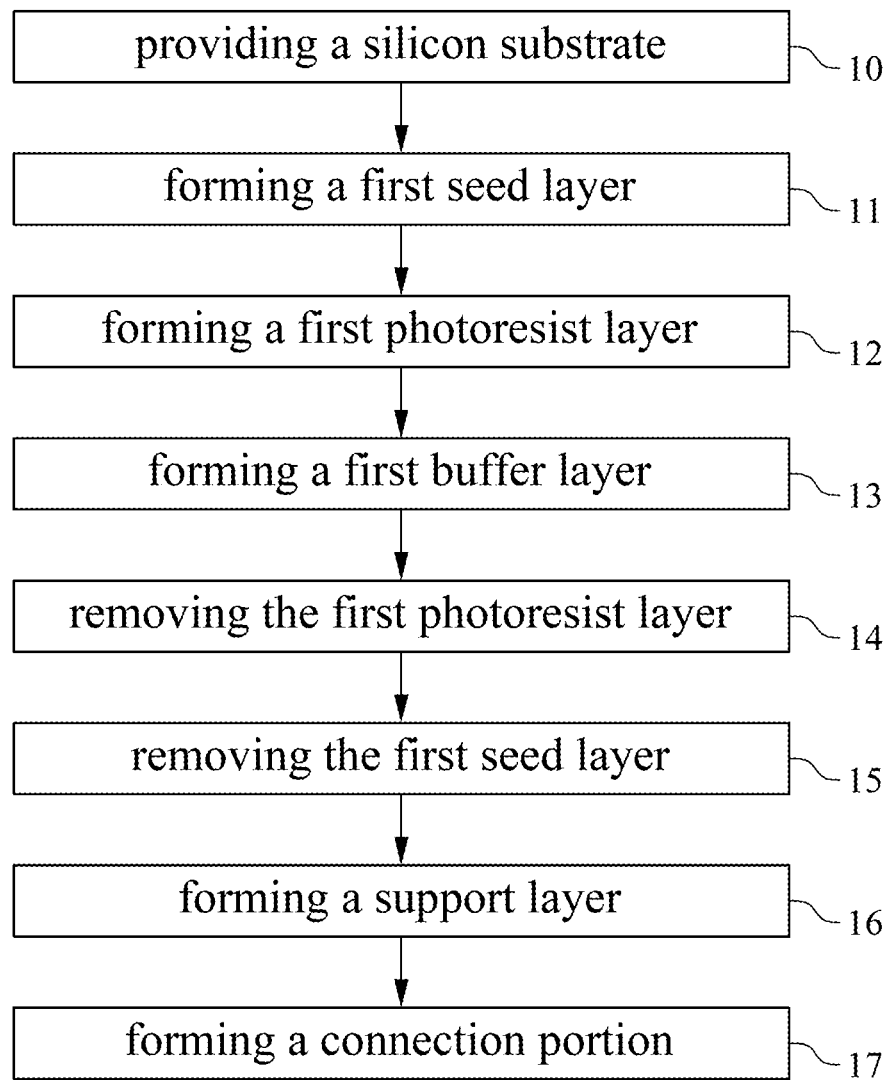
FIG. 2 is a flow chart illustrating a semiconductor manufacturing process in accordance with a preferred embodiment of the present invention.
Figure 3C:
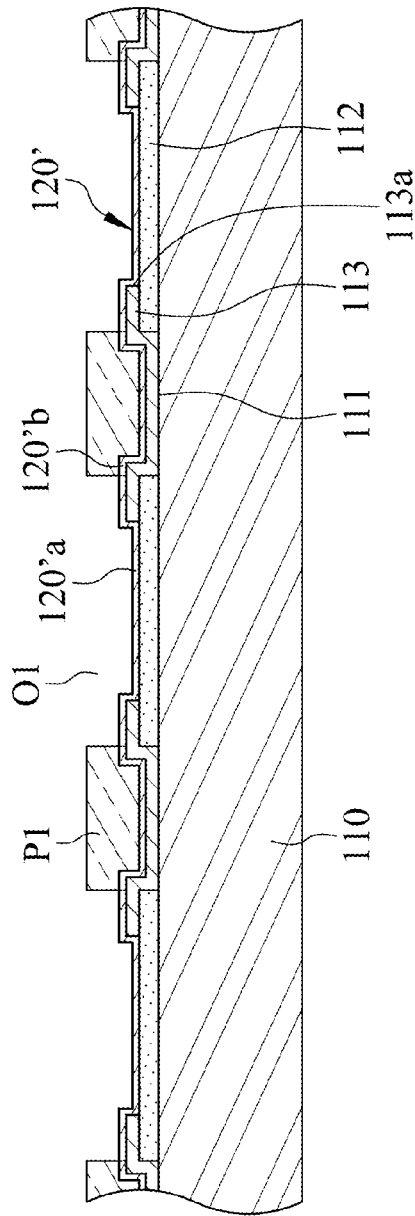
Figure 3D:
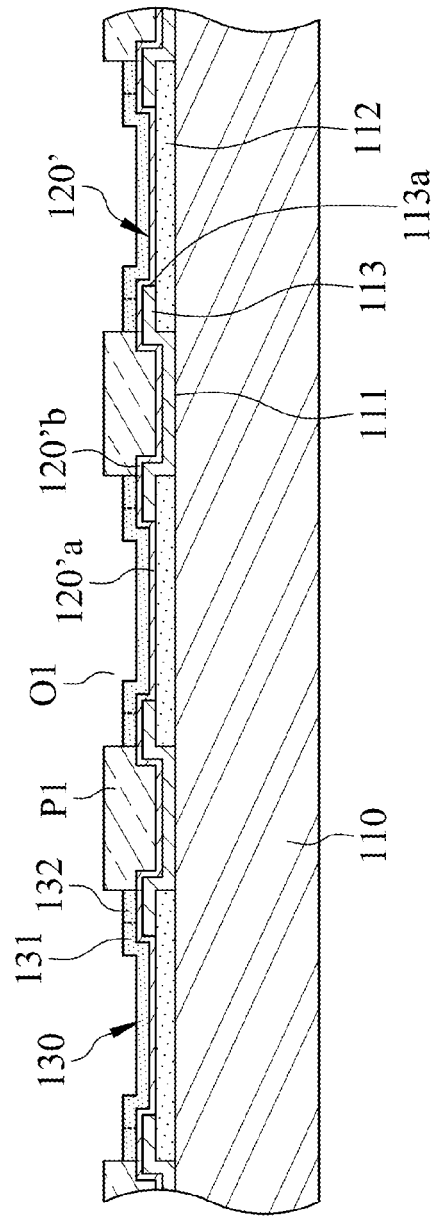
Figure 3G:
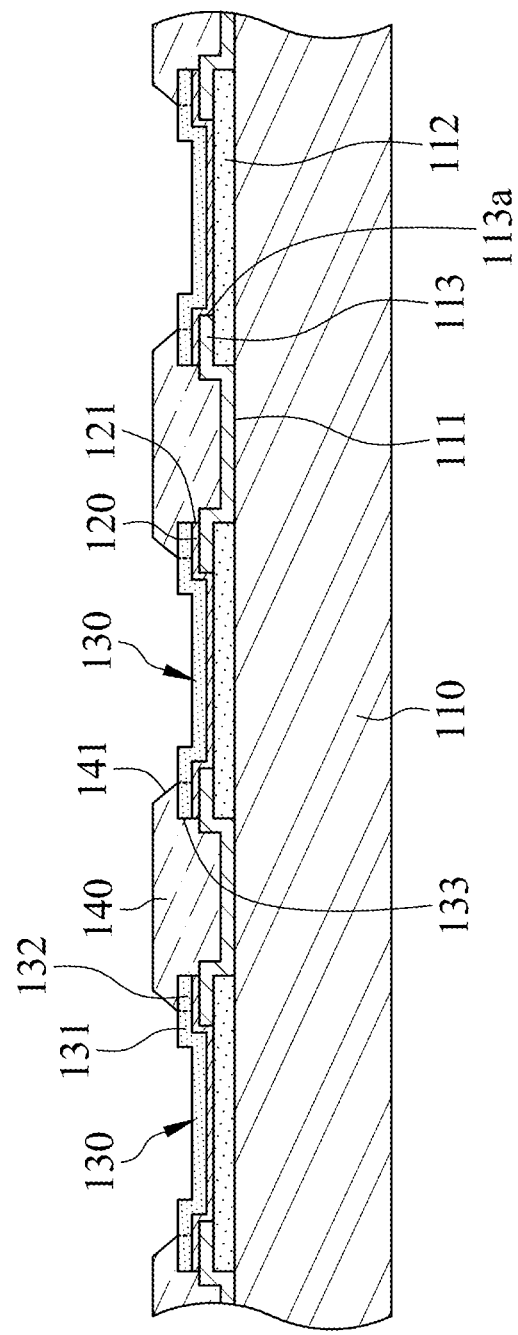
Figure 3H:
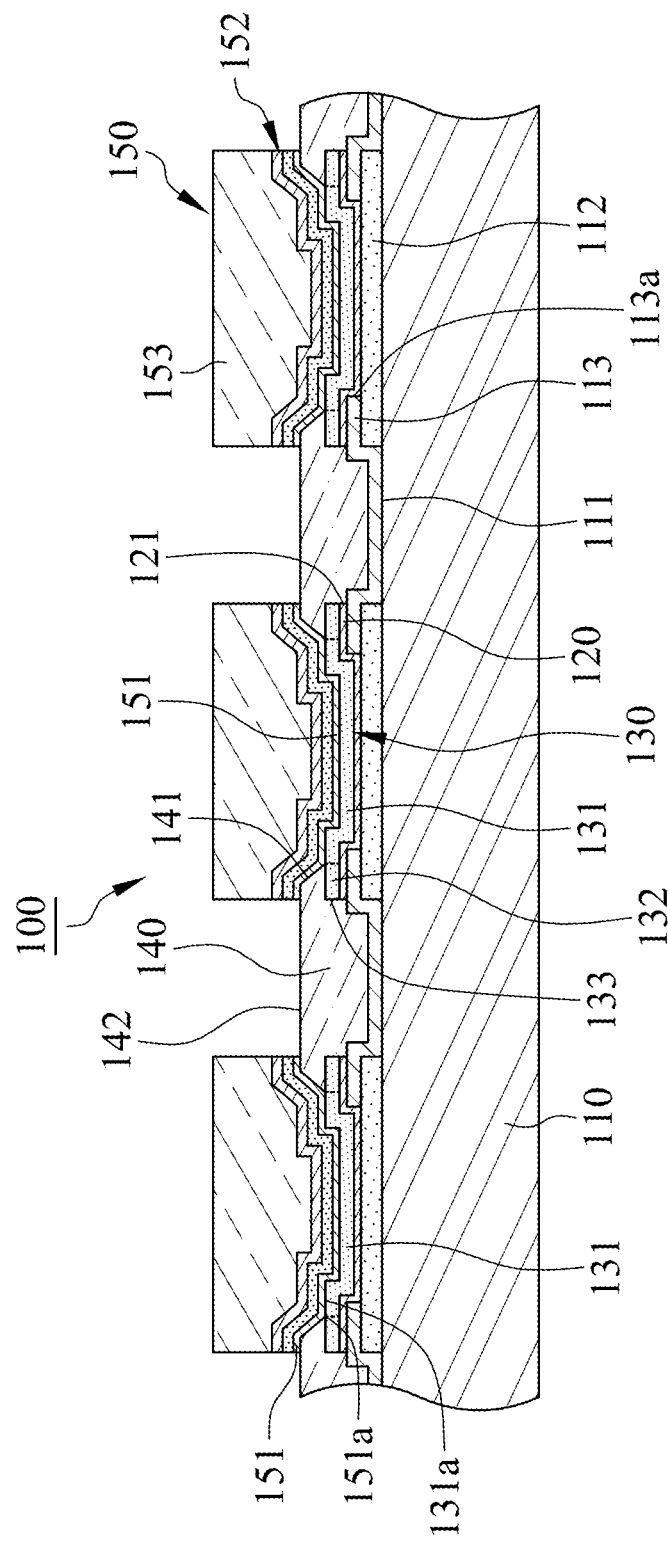

With reference to FIGS. 2 and 3A to 3I, a semiconductor manufacturing process in accordance with a preferred embodiment of the present invention includes the steps described as followed: first, referring to step 10 of FIG. 2 and FIG. 3A, providing a silicon substrate 110 having a surface 111, at least one connection pad 112 formed on the surface 111 and a protection layer 113 formed on the surface 111, the protection layer 113 covers the connection pad 112 and comprises at least one first opening 113a revealing the connection pad 112; next, referring to step 11 of FIG. 2 and FIG. 3B, forming a first seed layer 120' on the protection layer 113 and the connection pad 112, the first seed layer 120' comprises at least one first section 120'a and at least one second section 120'b located outside the first section 120'a, and the material of the first seed layer 120' is selected from one of titanium-copper alloy or titanium-tungsten-copper alloy; afterwards, referring to step 12 of FIG. 2 and FIG. 3C, forming a first photoresist layer P1 on the first seed layer 120', wherein the first photoresist layer P1 comprises at least one first opening slot O1 to reveal the first section 120'a; thereafter, referring to step 13 of FIG. 2 and FIG. 3D, forming a first buffer layer 130 at the first opening slot O1, the first buffer layer 130 covers the first section 120'a of the first seed layer 120' and comprises a coupling portion 131 and a cladding portion 132, and the material of the first buffer layer 130 is selected from one of copper or nickel; after that, referring to step 14 of FIG. 2 and FIG. 3E, removing the first photoresist layer P1 to reveal the second section 120'b of the first seed layer 120'; next, referring to step 15 of FIG. 2 and FIG. 3F, removing the second section 120'b of the first seed layer 120' to make the first section 120'a formed as a first under bump metallurgy layer 120; afterwards, referring to step 16 of FIG. 2 and FIG. 3G, forming a support layer 140 on the protection layer 113 and the first buffer layer 130, the support layer 140 comprises at least one second opening 141 revealing the coupling portion 131 of the first buffer layer 130, the first under bump metallurgy layer 120 comprises a first ring wall 121, the first buffer layer 130 comprises a second ring wall 133, wherein the first ring wall 121 of the first under bump metallurgy layer 120, the second ring wall 133 and the cladding portion 132 of the first buffer layer 130 are cladded by the support layer 140, and the material of the support layer 140 is selected from one of Polyimide (PI), Poly-p-phenylene benzo-bisoxazazole (PBO), or Benezocy-clobutene (BCB); thereafter, referring to step 17 of FIG. 2 and FIG. 3H, forming a connection portion 150 at the second opening 141 and covering the coupling portion 131 of the first buffer layer 130 with the connection portion 150, preferably, the connection portion 150 further includes a second under bump metallurgy layer 151, a second buffer layer 152 and a soldering layer 153, the second under bump metallurgy layer 151 covers the coupling portion 131 of the first buffer layer 130, the support layer 140 comprises a top surface 142, the second under bump metallurgy layer 151 covers the top surface 142, in this embodiment, the coupling portion 131 of the first buffer layer 130 comprises a coupling surface 131a, the second under bump metallurgy layer 151 comprises an abutting edge 151a in contact with the coupling surface 131a, the second buffer layer 152 covers the second under bump metallurgy layer 151, and the soldering layer 153 covers the second buffer layer 152.

Figure 3I:
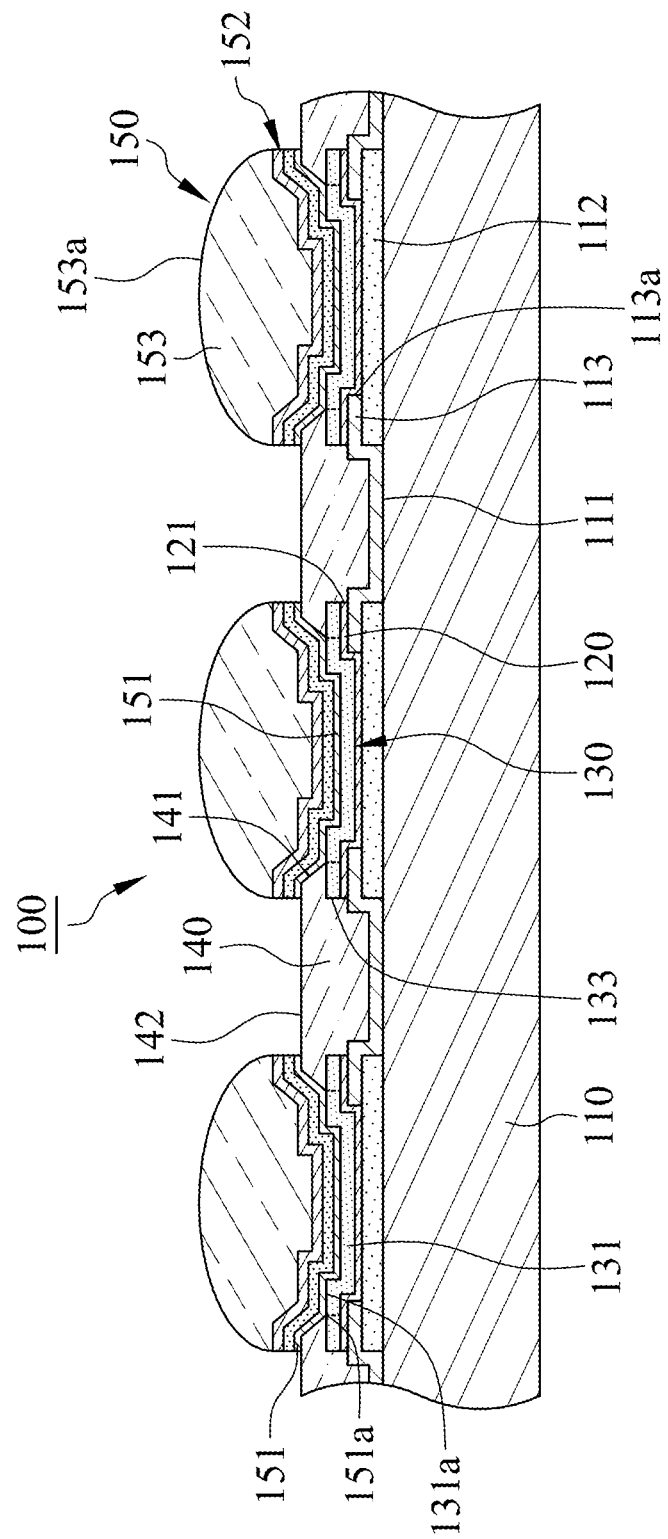
Figure 4:
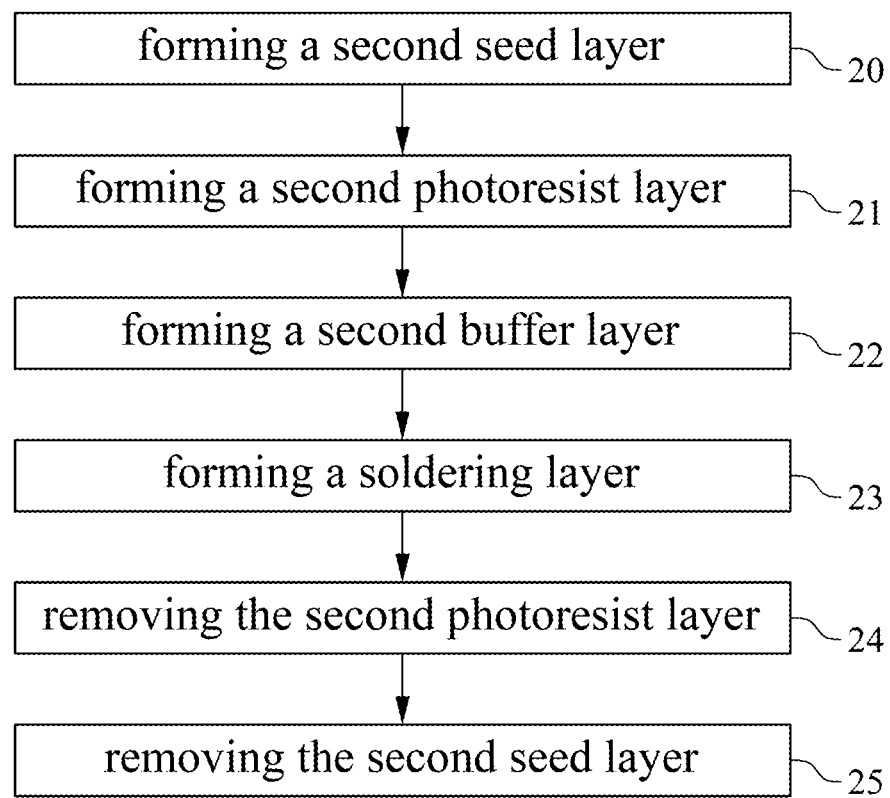
FIG. 4 is a flow chart illustrating a manufacturing process of a connection portion in accordance with a preferred embodiment of the present invention.
Figure 5A:
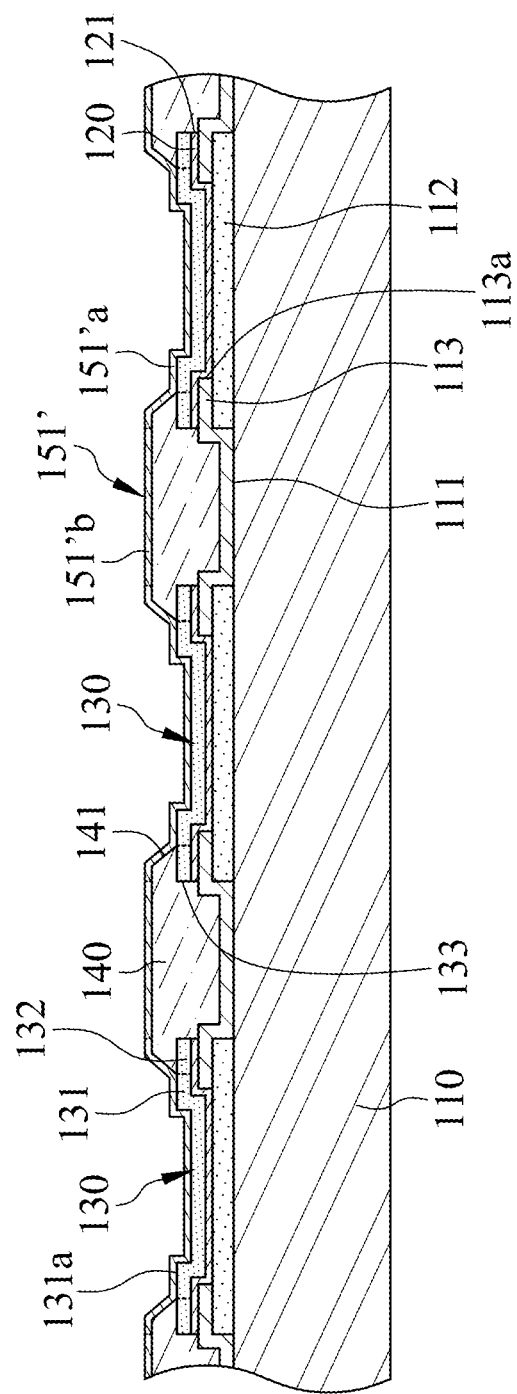
FIGS. 5A to 5E are cross-section views illustrating the manufacturing process of the connection portion in accordance with a preferred embodiment of the present invention.
Figure 5B:
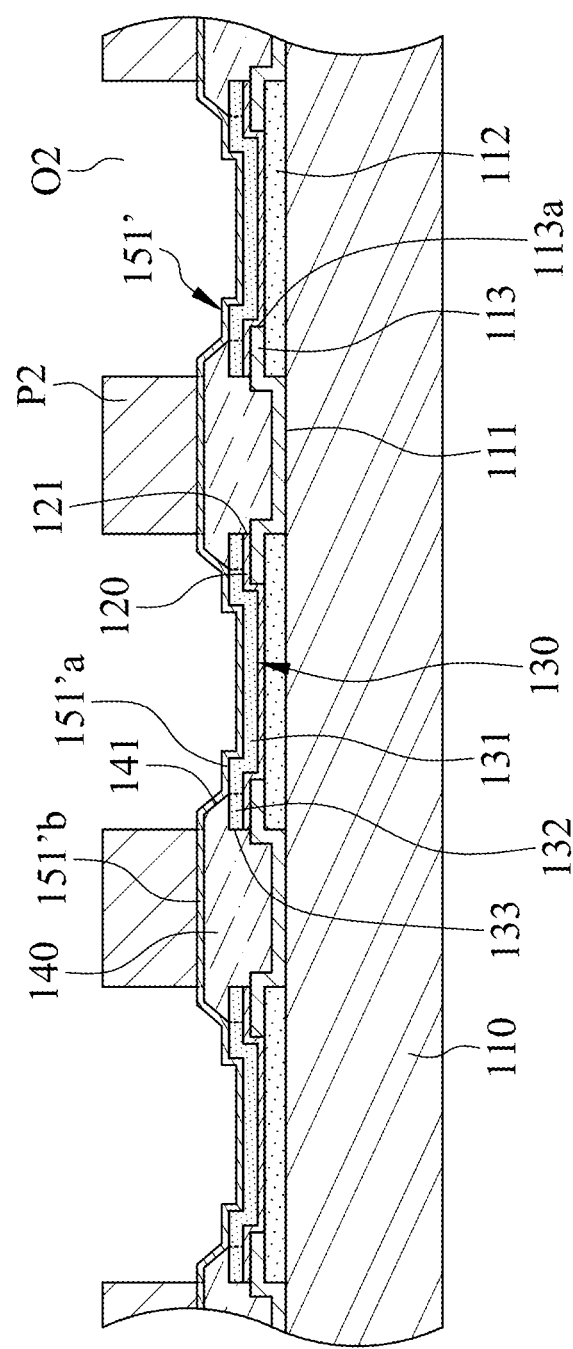
Figure 5C:
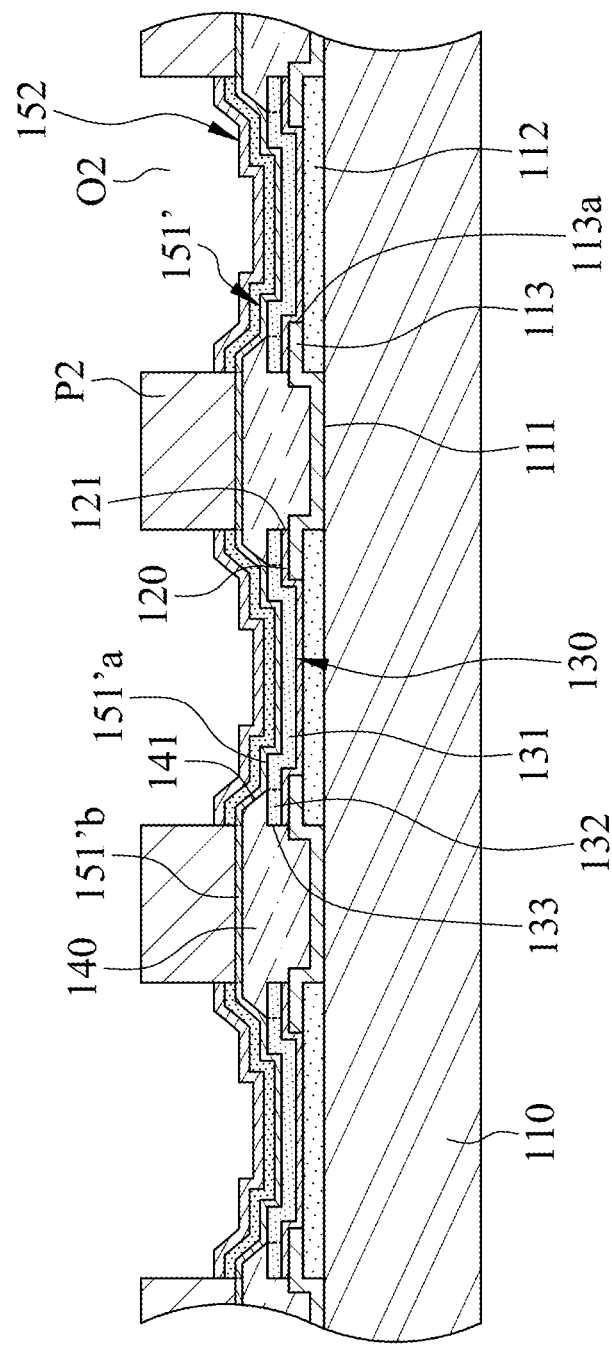
Figure 5D:
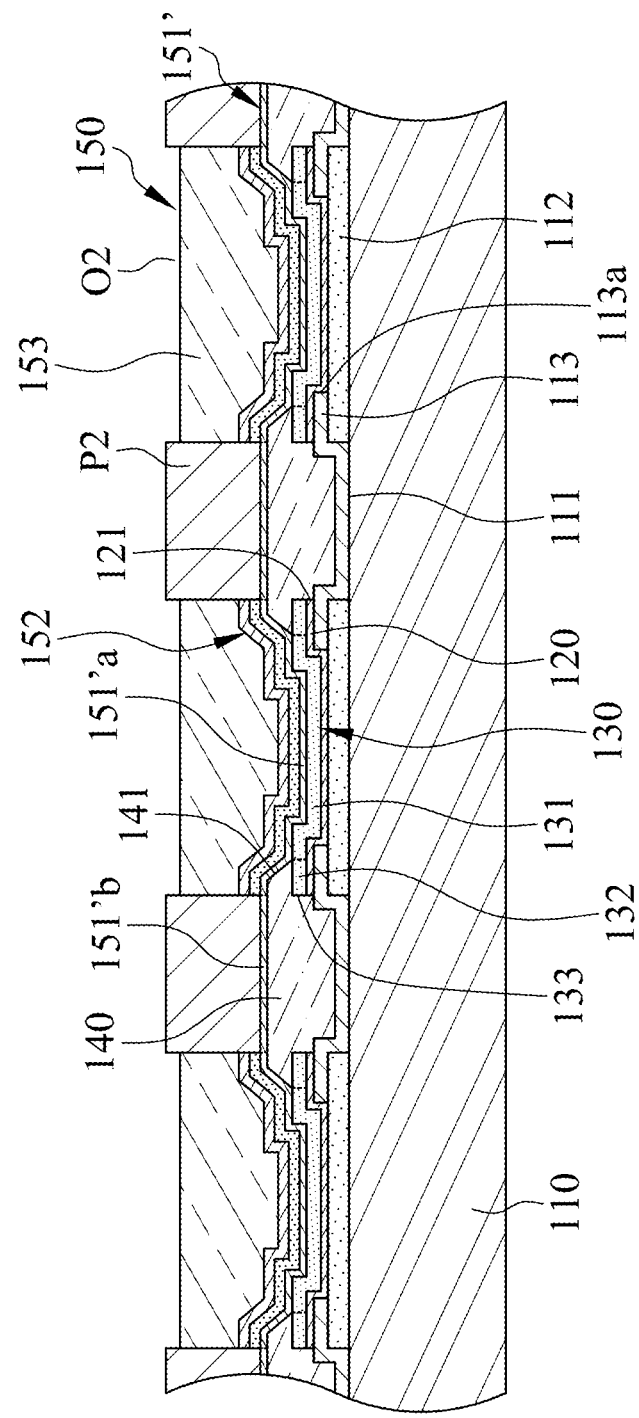
Figure 5E:
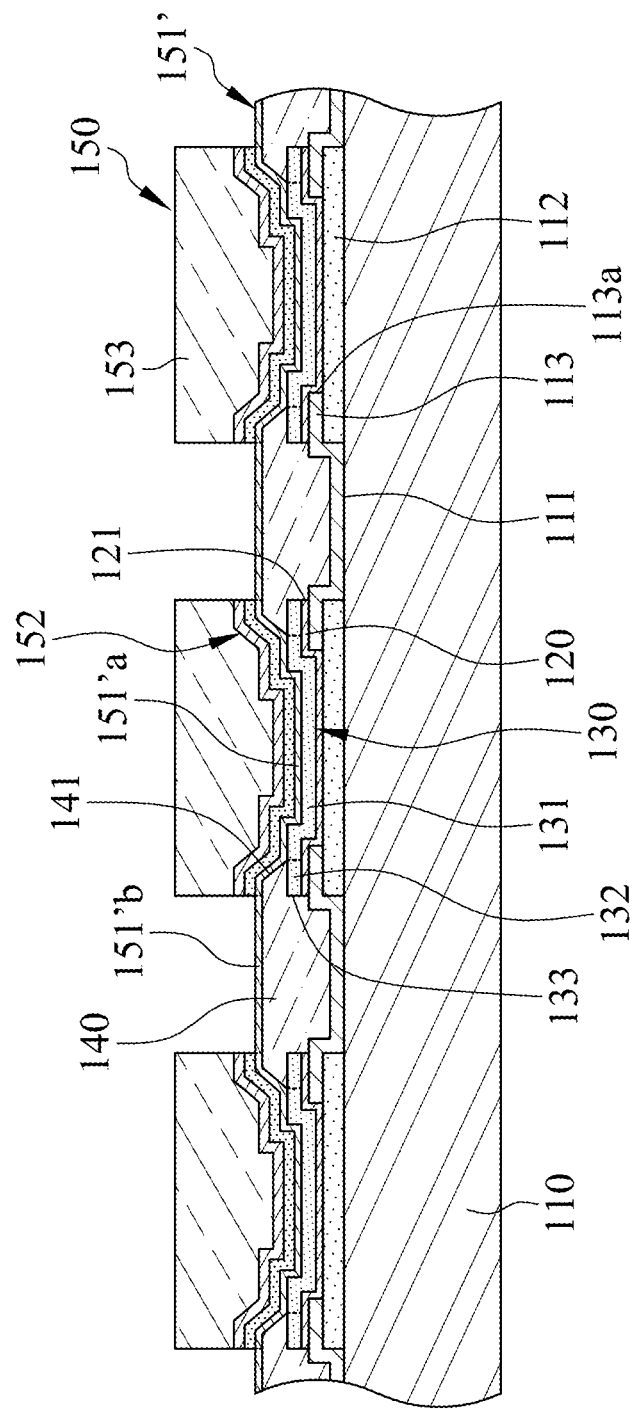

Furthermore, with reference to FIGS. 4 and 5A to 5E, the step of forming the connection portion 150 further includes the following steps: first, referring to step 20 of FIG. 4 and FIG. 5A, forming a second seed layer 151' on the support layer 140 and covering the first buffer layer 130 with the second seed layer 151', wherein the second seed layer 151' comprises at least one third section 151'a and at least one fourth section 151'b located outside the third section 151'a, and the material of the second seed layer 151' is selected from one of titanium-copper alloy or titanium-tungsten-copper alloy; next, referring to step 21 of FIG. 4 and FIG. 5B, forming a second photoresist layer P2 on the second seed layer 151', wherein the second photoresist layer P2 comprises at least one second opening slot O2 to reveal the third section 151'a; thereafter, referring to step 22 of FIG. 4 and FIG. 5C, forming the second buffer layer 152 at the second opening slot O2 and covering the third section 151'a of the second seed layer 151' with the second buffer layer 152, wherein the material of the second buffer layer 152 is selected from one of copper, nickel, or copper-nickel alloy; afterwards, referring to step 23 of FIG. 4 and FIG. 5D, forming the soldering layer 153 on the second buffer layer 152; after that, referring to step 24 of FIG. 4 and FIG. 5E, removing the second photoresist layer P2 to reveal the fourth section 151'b of the second seed layer 151'; next, removing the fourth section 151'b of the second seed layer 151' to make the third section 151'a formed as the second under bump metallurgy layer 151 therefore forming a semiconductor structure 100; eventually, referring to FIG. 3I, reflowing the soldering layer 153 to make the soldering layer 153 generate an arc-shaped surface 153a. Under the ball shear test for the semiconductor structure 100, owning to the reasons that firstly the first ring wall 121 of the first under bump metallurgy layer 120, the second ring wall 133 and the cladding portion 132 of the first buffer layer 130 are cladded by the support layer 140, secondly the first under bump metallurgy layer 120 is covered by the first buffer layer 130 and thirdly the abutting edge 151a of the second under bump metallurgy layer 151 contacts the coupling surface 131a, therefore, the semiconductor structure 100 of the present invention prevents the first under bump metallurgy layer 120 from separating from the connection pad 112 or from damaging the connection pad 112 so that the yield rate in manufacturing the semiconductor structure 100 is well increased.

With reference to FIG. 3H, a semiconductor structure 100 in accordance with the present invention at least includes a silicon substrate 110, at least one first under bump metallurgy layer 120, at least one first buffer layer 130, a support layer 140 and at least one connection portion 150, wherein the silicon substrate 110 comprises a surface 111, at least one connection pad 112 formed on the surface 111 and a protection layer 113 formed on the surface 111, the protection layer 113 covers the connection pad 112 and comprises at least one first opening 113a revealing the connection pad 112, the first under bump metallurgy layer 120 covers the protection layer 113 and the connection pad 112, and the material of the first under bump metallurgy layer 120 is selected from one of titanium-copper alloy or titanium-tungsten-copper alloy. The first under bump metallurgy layer 120 comprises a first ring wall 121, the first buffer layer 130 is formed on the first under bump metallurgy layer 120, and the material of the first buffer layer 130 is selected from one of copper or nickel. The first buffer layer 130 comprises a coupling portion 131, a cladding portion 132 and a second ring wall 133. The support layer 140 is formed on the protection layer 113, the first under bump metallurgy layer 120 and the first buffer layer 130, the material of the support layer 140 is selected from one of Polyimide (PI), Poly-p-phenylene benzo-bisoxazazole (PBO), or Benezocy-clobutene (BCB), the support layer 140 comprises a top surface 142 and at least one second opening 141 revealing the coupling portion 131 of the first buffer layer 130, wherein the first ring wall 121 of the first under bump metallurgy layer 120, the second ring wall 133 and the cladding portion 132 of the first buffer layer 130 are cladded by the support layer 140. The connection portion 150 is formed at the second opening 141 and covers the coupling portion 131 of the first buffer layer 130, in this embodiment, the connection portion 150 includes a second under bump metallurgy layer 151, a second buffer layer 152 and a soldering layer 153, the second under bump metallurgy layer 151 is formed at the second opening 141 and covers the coupling portion 131 of the first buffer layer 130, and the material of the second under bump metallurgy layer 151 is selected from one of titanium-copper alloy or titanium-tungsten-copper alloy. The second buffer layer 152 covers the second under bump metallurgy layer 151, and the material of the second buffer layer 152 is selected from one of copper, nickel or copper-nickel alloy. The soldering layer 153 covers the second buffer layer 152, and the second under bump metallurgy layer 151 covers the top surface 142 of the support layer 140. Preferably, the coupling portion 131 of the first buffer layer 130 comprises a coupling surface 131a, and the second under bump metallurgy layer 151 comprises an abutting edge 151a in contact with the coupling surface 131a.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor manufacturing process at least includes:
   providing a silicon substrate having a surface, at least one connection pad formed on the surface and a protection layer formed on the surface, the protection layer covers the connection pad and comprises at least one first opening revealing the connection pad;
   forming a first seed layer on the protection layer and the connection pad, the first seed layer comprises at least one first section and at least one second section located outside the first section;
   forming a first photoresist layer on the first seed layer, wherein the first photoresist layer comprises at least one first opening slot to reveal the first section;

forming a first buffer layer at the first opening slot, the first buffer layer covers the first section of the first seed layer and comprises a coupling portion and a cladding portion;

removing the first photoresist layer to reveal the second section of the first seed layer;

removing the second section of the first seed layer to make the first section formed as a first under bump metallurgy layer;

forming a support layer on the protection layer and the first buffer layer, the support layer comprises at least one second opening revealing the coupling portion of the first buffer layer, the first under bump metallurgy layer comprises a first ring wall, the first buffer layer comprises a second ring wall, wherein the first ring wall of the first under bump metallurgy layer, the second ring wall and the cladding portion of the first buffer layer are cladded by the support layer; and forming a connection portion at the second opening and covering the coupling portion of the first buffer layer with the connection portion.

2. The semiconductor manufacturing process in accordance with claim 1, wherein the connection portion includes a second under bump metallurgy layer, a second buffer layer and a soldering layer, the second under bump metallurgy layer covers the coupling portion of the first buffer layer, the second buffer layer covers the second under bump metallurgy layer, and the soldering layer covers the second buffer layer.

3. The semiconductor manufacturing process in accordance with claim 2, wherein the support layer comprises a top surface, the second under bump metallurgy layer covers the top surface.

4. The semiconductor manufacturing process in accordance with claim 2, wherein the step of forming the connection portion further includes:

forming a second seed layer on the support layer and covering the first buffer layer with the second seed layer, the second seed layer comprises at least one third section and at least one fourth section located outside the third section;

forming a second photoresist layer on the second seed layer, wherein the second photoresist layer comprises at least one second opening slot to reveal the third section;

forming the second buffer layer at the second opening slot and covering the third section of the second seed layer with the second buffer layer;

forming the soldering layer on the second buffer layer;

removing the second photoresist layer to reveal the fourth section of the second seed layer; and removing the fourth section of the second photoresist layer to make the third section formed as the second under bump metallurgy layer.

5. The semiconductor manufacturing process in accordance with claim 4 further includes a step of reflowing the soldering layer after the step of removing the fourth section of the second seed layer.

6. The semiconductor manufacturing process in accordance with claim 1, wherein the material of the first seed layer is selected from one of titanium-copper alloy or titanium-tungsten-copper alloy.

7. The semiconductor manufacturing process in accordance with claim 1, wherein the material of the support layer is selected from one of Polyimide, Poly-p-phenylene benzobisoxazazole, or Benezocy-clobutene.

8. The semiconductor manufacturing process in accordance with claim 4, wherein the material of the second seed layer is selected from one of titanium-copper alloy or titanium-tungsten-copper alloy.

9. The semiconductor manufacturing process in accordance with claim 1, wherein the material of the first buffer layer is selected from one of copper or nickel.

10. The semiconductor manufacturing process in accordance with claim 2, wherein the material of the second buffer layer is selected from one of copper, nickel, or copper-nickel alloy.

11. The semiconductor manufacturing process in accordance with claim 2, wherein the coupling portion of the first buffer layer comprises a coupling surface, the second under bump metallurgy layer comprises an abutting edge in contact with the coupling surface.

* * * * *